US006973290B2

(12) United States Patent
Litwin et al.

(10) Patent No.: US 6,973,290 B2
(45) Date of Patent: Dec. 6, 2005

(54) RADIO ARCHITECTURE

(75) Inventors: Andrej Litwin, Danderyd (SE); Sven Erik Mattisson, Bjarred (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 124 days.

(21) Appl. No.: 10/460,499

(22) Filed: Jun. 13, 2003

(65) Prior Publication Data

US 2003/0211833 A1 Nov. 13, 2003

Related U.S. Application Data

(62) Division of application No. 09/018,937, filed on Feb. 5, 1998, now Pat. No. 6,611,680.

(30) Foreign Application Priority Data

Feb. 5, 1997 (GB) .................................. 9702375

(51) Int. Cl.$^7$ ............................................... H04B 1/38
(52) U.S. Cl. .................. 455/73; 455/333; 257/E27.001
(58) Field of Search ........................... 455/73, 83, 333, 455/334, 550.1; 257/69, 314, 499, 500, E27.001, 257/E27.06

(56) References Cited

U.S. PATENT DOCUMENTS

| 4,142,114 A | 2/1979 | Green |
| 4,897,662 A * | 1/1990 | Lee et al. .................. 343/701 |
| 4,945,066 A | 7/1990 | Kang et al. |
| 4,979,230 A | 12/1990 | Marz |
| 5,111,152 A * | 5/1992 | Makino .................. 329/300 |
| 5,248,627 A | 9/1993 | Williams |
| 5,379,457 A | 1/1995 | Nguyen |
| 5,407,849 A | 4/1995 | Khambaty et al. |
| 5,465,408 A | 11/1995 | Sugayama et al. |
| 5,465,418 A | 11/1995 | Zhou et al. |
| 5,506,544 A | 4/1996 | Staudinger et al. |
| 5,532,637 A | 7/1996 | Khoury et al. |
| 5,541,548 A | 7/1996 | Crafts |
| 5,557,231 A * | 9/1996 | Yamaguchi et al. ........ 327/534 |
| 5,585,288 A | 12/1996 | Davis et al. |
| 5,589,701 A * | 12/1996 | Baldi .......................... 257/369 |
| 5,600,275 A * | 2/1997 | Garavan ..................... 327/307 |
| 5,629,638 A | 5/1997 | Kumar |
| 5,708,391 A * | 1/1998 | Altmann et al. ............. 330/252 |
| 5,717,345 A * | 2/1998 | Yokomizo et al. ............ 326/80 |
| 5,729,154 A * | 3/1998 | Taguchi et al. ................ 326/30 |
| 5,731,612 A | 3/1998 | Buxo et al. |
| 5,757,215 A | 5/1998 | Schuelke et al. |
| 5,758,274 A * | 5/1998 | Vu et al. .................. 455/246.1 |
| 5,760,449 A | 6/1998 | Welch |

(Continued)

FOREIGN PATENT DOCUMENTS

EP 55030862 4/1980

(Continued)

OTHER PUBLICATIONS

Shin'ichiro Mutoh et al,, "A 1-V Multithreshold-Voltage CMOS Digital Signal Processor for Mobile Phone Application", IEEE Journal of Solid-State Circuits, vol. 31, No. 11, Nov. 1996, pp. 1795-1802.

(Continued)

Primary Examiner—CongVan Tran
(74) Attorney, Agent, or Firm—Potomac Patent Group PLLC

(57) ABSTRACT

A digital radio transceiver integrated circuit includes MOS transistors with normal threshold voltages in the digital circuits, and with reduced threshold voltages in at least some of the analog RF components. This allows the transceiver to be reduced in size and weight, without requiring performance to be compromised.

14 Claims, 2 Drawing Sheets

U.S. PATENT DOCUMENTS

| | | | |
|---|---|---|---|
| 5,838,117 A | 11/1998 | Nerone | |
| 5,874,835 A * | 2/1999 | Ishiwaki et al. | 326/56 |
| 5,886,562 A * | 3/1999 | Garrity et al. | 327/415 |
| 5,917,861 A | 6/1999 | Belveze et al. | |
| 5,923,184 A | 7/1999 | Ooms et al. | |
| 5,966,032 A * | 10/1999 | Elrabaa et al. | 326/84 |
| 5,973,533 A | 10/1999 | Nagaoka | |
| 6,026,287 A | 2/2000 | Puechberty et al. | |
| 6,194,945 B1 * | 2/2001 | Bahramzadeh | 327/333 |
| 2004/0212525 A1 * | 10/2004 | Mallinson | 341/144 |

FOREIGN PATENT DOCUMENTS

| | | |
|---|---|---|
| EP | 163 461 A2 | 12/1985 |
| EP | 06283675 | 7/1994 |
| EP | 653 843 A2 | 5/1995 |
| EP | 676 798 A2 | 10/1995 |
| EP | 694 976 A2 | 1/1996 |
| JP | 57-63925 | 4/1982 |
| JP | 63-87010 | 4/1988 |
| JP | 63-246021 | 10/1988 |
| JP | 06-104383 A | 4/1994 |
| JP | 8-330590 | 12/1996 |
| JP | 09-027594 A | 1/1997 |
| RU | 1331277 A1 | 8/1983 |

OTHER PUBLICATIONS

Shin'ichiro Mutoh et al., "*1V High-Speed Digital Circuit Technology with 0.5 µm Multi-Threshold CMOS*", IEEE Journal, 1993, pp. 186-189.

Sa H. Bang et al., "*A Compact Low-Power VLSI Transceiver for Wireless Communication*", IEEE Transactions on Circuits and Systems--1: Fundamental Theory and Applications, vol. 42, No. 11, Nov. 1995, pp. 933-945.

Samuen Sheng et al., "SP 21.4: A Low-Power CMOS Chipset for Spread-Spectrum Communications," 1966 IEEE International Solid-State Circuits Conference, pps. 346-347, 471.

\* cited by examiner

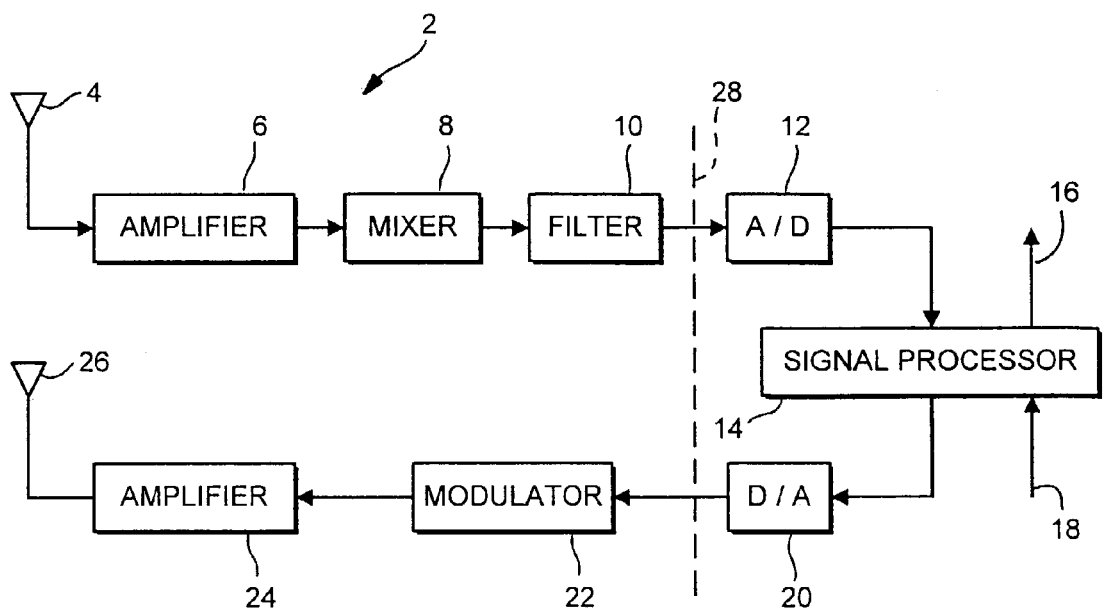
FIG. 1
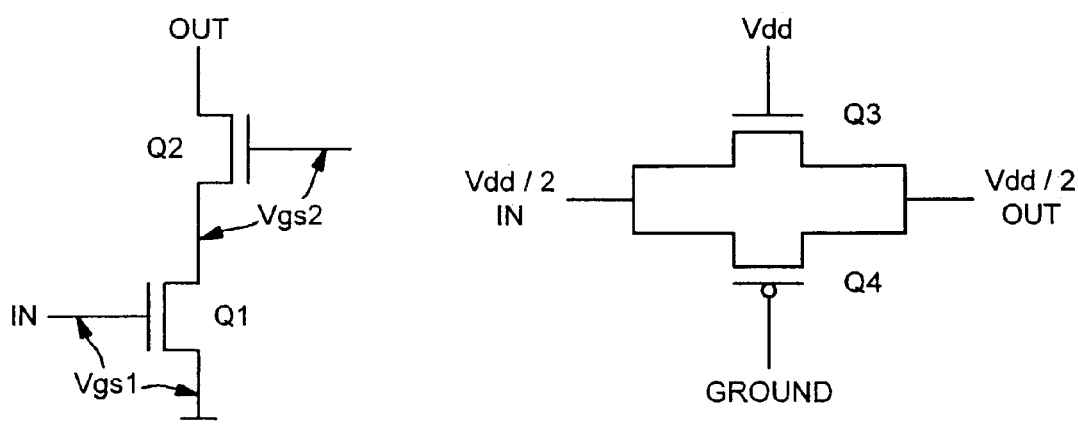
FIG. 3
FIG. 4

RADIO ARCHITECTURE

This application is a divisional of application Ser. No. 09/018,937, filed on Feb. 5, 1998 now U.S. Pat. No. 6,611,680.

TECHNICAL FIELD OF THE INVENTION

This invention relates to a radio architecture, and in particular to a CMOS architecture for a digital radio transceiver.

DESCRIPTION OF RELATED ART

It is necessary, in the field of digital mobile telephony, to transmit and receive radio signals which carry digital signals. Moreover, it is preferable that the mobile transceiver should be as small and light as possible, with low power requirements. It is advantageous to realise the digital components of the transceiver, such as a digital signal processor and an A/D converter and a D/A converter, using CMOS manufacturing techniques. This means that it is also advantageous, from the manufacturing point of view, to realise the analog components of the transceiver, such as amplifiers, mixers, etc, using the same CMOS manufacturing techniques. An architecture of this type is disclosed in "A Low-Power CMOS Chipset for Spread-Spectrum Communications", S. Sheng, et al, International Solid-State Circuits Conference, 1996.

However, CMOS transistors are normally designed to function as switches with low leakage currents. A consequence of this is that such transistors are less suitable for use in analog RF circuits. For example, they typically have low transconductances, especially at low bias voltages, resulting in low gain and high (phase) noise.

U.S. Pat. No. 5,407,849 discloses a method of manufacturing a CMOS circuit in which the threshold voltage of some of the transistors (FET's) is reduced, for example to be close to zero volts.

SUMMARY OF THE INVENTION

Thus the prior art radio architectures involve compromising the performance of the device, if it is decided to use CMOS processes to realise the whole of the circuits. Meanwhile, U.S. Pat. No. 5,407,849 discloses reducing the threshold voltage of some of the FET's in a CMOS circuit, but fails to disclose how this might have any application to radio architectures.

The invention involves using transistors with different threshold voltages in different parts of an integrated circuit for a digital radio.

Advantageously, the invention involves using transistors with high or normal threshold voltages in the circuits which handle the digital signals, and transistors with reduced threshold voltages in the circuits which process the analog signals.

In addition, the invention may also involve using some transistors with high or normal threshold voltages and some transistors with reduced threshold voltages in the front-end circuits of a radio transceiver. Such a transceiver may be a CMOS arrangement, or may use only NMOS or PMOS devices.

BRIEF DESCRIPTION OF THE DRAWING

FIG. 1 is a block schematic diagram of a radio transceiver in accordance with the invention.

FIG. 3 shows a first conventional circuit to illustrate the advantages of the present invention.

FIG. 4 shows a second conventional circuit to illustrate the advantages of the present invention.

DETAILED DESCRIPTION OF EMBODIMENTS

Figure 2:
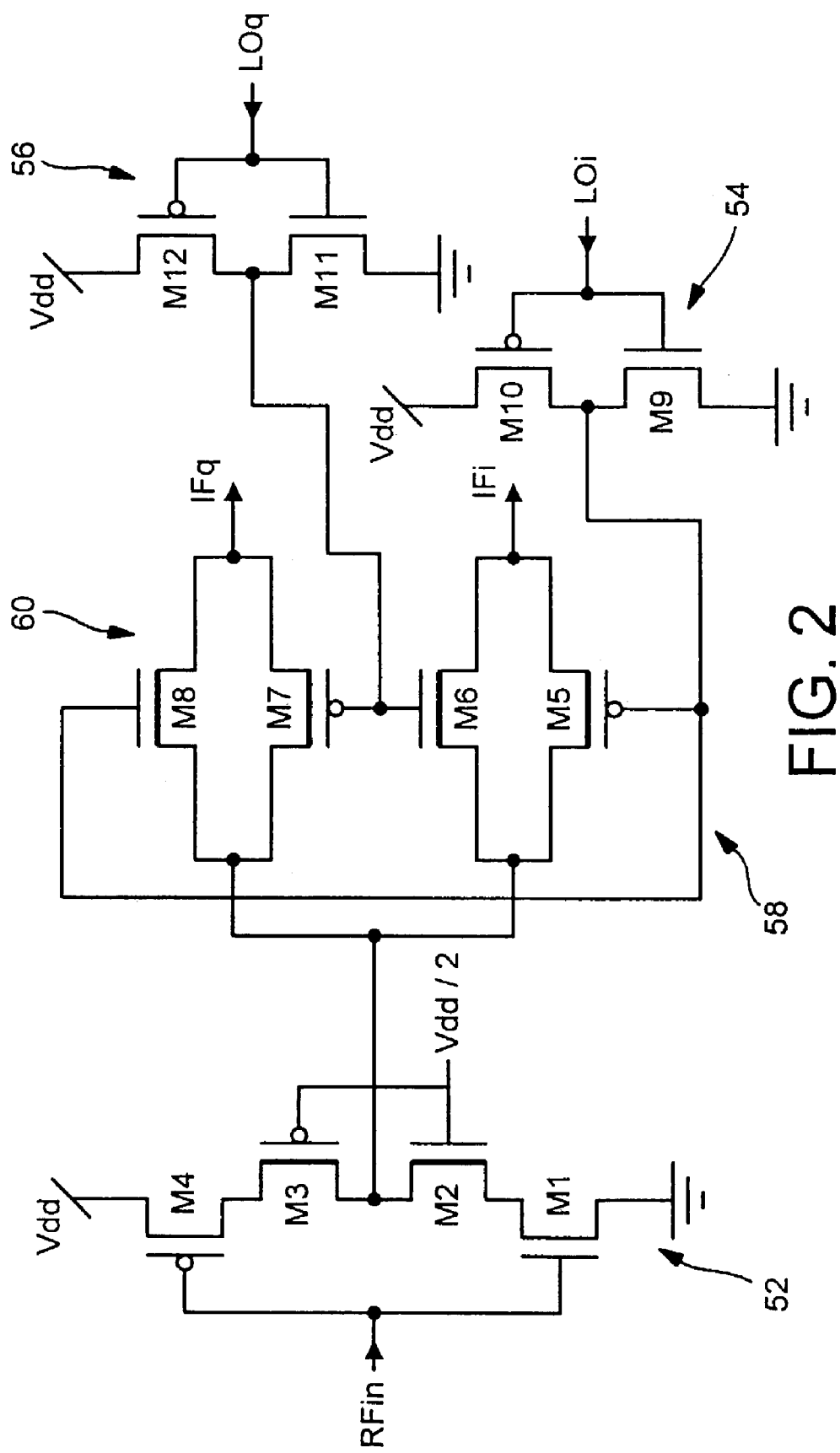
FIG. 2 is a schematic circuit diagram of a front-end circuit in accordance with the invention.

As shown in FIG. 1, a radio transceiver 2, for use in a mobile telephone, has a receive antenna 4 for receiving radio signals, and a low-noise amplifier 6 for restoring the received signals to usable levels. The amplified signals pass to a mixer 8, where they are converted from radio frequency to a lower intermediate frequency, and are then filtered in a filter 10. The filtered signals pass to an analog-digital (A/D) converter 12, which converts the signals to a digital form, in which they can be handled by a signal processor 14, following which they are output on line 16.

Signals for transmission are supplied in digital form on line 18 to the signal processor 14, and then, after processing, are supplied to a digital-analog (D/A) converter 20. After conversion to analog form, the signals are sent to a modulator 22 for conversion to radio frequency, and then to a power amplifier 24, and a transmit antenna 26 (which may be combined with the receive antenna 4), for transmission as a radio signal.

The general structure of the transceiver as outlined above will be familiar to the person skilled in the art, and it will be apparent that various changes and modifications are possible.

Moreover, it has been proposed that it would be advantageous to integrate the circuits in a single chip.

It has now been recognized by the present inventors that the transceiver shown in FIG. 1 includes circuits of two distinct types, which present different requirements, and that those conflicting requirements can be met by using transistors with different threshold voltages in the different types of circuit. This allows the performance of the transceiver to be optimized, while still allowing the radio circuits to be formed in a single monolithic integrated circuit, which has advantages from the point of view of size and weight of the telephone.

Specifically, the digital parts of the circuit, for example the A/D converter and the D/A converter, are advantageously formed using CMOS transistors with normal (sometimes referred to herein as high) threshold voltages, for example in the region of +1V for a NMOS device or −3V for a PMOS device. Thus the magnitude of the threshold voltage in each case is greater than 0.5V. By contrast, the analog RF parts of the circuit, for example the amplifiers, are advantageously formed using CMOS transistors with reduced threshold voltages, with magnitudes less than 0.5V. This can result in lower power consumption, lower noise, and higher bandwidth. The threshold voltages are preferably reduced to close to zero, or even beyond zero. Thus, the NMOS transistors may have small negative threshold voltages, while the PMOS transistors may have small positive threshold voltages.

The dashed line 28 in FIG. 1 shows one presently preferred division of the circuit. Circuits to the right of the line 28 may have transistors with high threshold voltages, while circuits to the left of the line 28 have transistors with low threshold voltages. However, other divisions are possible, and indeed it is possible to use transistors with different threshold voltages in different parts of the same circuit.

As disclosed in U.S. Pat. No. 5,407,849, it is possible to achieve the different threshold voltages in different transistors by changing the threshold implantation doses in selected parts of the semiconductor device, either by using existing masks, or by adding extra masks.

There is thus disclosed a radio architecture which can be integrated on a single chip, without sacrificing performance.

FIG. 2 is a schematic circuit diagram of a radio receiver front-end circuit in accordance with the invention. As mentioned briefly above, this circuit includes transistors with different threshold voltages. In the drawing, only the transistors are shown for clarity. In FIG. 2, transistors with reduced threshold voltages are shown with thick drain-source channels. As mentioned above, the threshold voltages of these devices can be greatly reduced, advantageously to near zero, or even below zero. Devices with thresholds below zero are called depletion devices. The rest of the circuit is conventional, and the general circuit design will be well known to the person skilled in the art. The transistors may be CMOS devices, or may be PMOS or NMOS devices.

Broadly, the receiver circuit of FIG. 2 includes an input amplifier stage 52, local oscillator drivers 54, 56, and a pair of mixers 58, 60. The circuit forms a single balanced front end. The circuit may be combined with another identical circuit to form a double balanced low-noise amplifier and mixer.

The amplifier stage 52 includes a pair of input transistors M1, M4, which are respectively connected to ground and to the supply voltage Vdd. An input radio frequency signal RFin is suppled to the gate of the first input transistor M1, and is supplied inverted to the second input transistor M4. The amplifier stage 52 also includes a pair of common gate transistors M2, M3, which receive the divided supply voltage Vdd/2 at their gates (inverted in the case of M3), and have their drain-source channels connected to the drain-source channels of the input transistors M1, M4.

It will be seen that the cascoded common gate transistors M2, M3 are low threshold devices.

The output from the amplifier stage 52 is supplied to an in-phase mixer 58 made up of transistors M5, M6, and to a quadrature mixer 60 made up of transistors M7, M8.

An in-phase local oscillator signal LOi is supplied to the gate of a transistor M9, and is supplied inverted to the gate of a transistor M10, the transistors M9 and M10 being connected between the supply voltage Vdd and ground, such that M9 and M10 form a local oscillator driver 54. The output signal from transistors M9 and M10 is supplied to the gate of transistor M8, and is supplied inverted to the gate of transistor M5.

A quadrature local oscillator signal LOq is supplied to the gate of a transistor M11, and is supplied inverted to the gate of a transistor M12, the transistors M11 and M12 being connected between the supply voltage Vdd and ground, such that M11 and M12 form a local oscillator driver 56. The output signal from transistors M11 and M12 is supplied to the gate of transistor M6, and is supplied inverted to the gate of transistor M7.

The output from the in-phase mixer 58 is an in-phase intermediate frequency signal IFi, and the output from the quadrature mixer 60 is a quadrature intermediate frequency signal IFq.

It will be seen that the transistors M5, M6, M7 and M8 are low threshold devices, while the local oscillator driver transistors M9, M10, M11 and M12 are of the regular-threshold type. In the case of the local oscillator driver transistors it is advantageous that the leakage currents in the off state should be minimised, and so the use of regular threshold transistors is preferred. Moreover, an advantage of using transistors with high or regular threshold voltages in a VCO is that this results in larger "signal swing" over the resonator, and hence lower (phase) noise.

The advantage of using low threshold devices in a cascade, as in the amplifier 52, will be explained with reference to FIG. 3. FIG. 3 shows two cascoded transistors Q1 and Q2, which have respective gate-source voltages Vgs1 and Vgs2. An input signal is applied to the gate of Q1, and an output signal is obtained at the drain of Q2. The gate-source voltage Vgs1 of the grounded source device Q1 must be at least high enough, compared with the threshold voltage Vth, that Vgs1−Vth=1V. Otherwise the device will not operate at RF. Similar considerations apply to Q2, which means that the gate voltage of Q2 must be set to at least about 2.8V. This may not achievable in a 3V process, and would almost certainly not be achievable in any process with lower supply voltage. However, if the threshold voltage were reduced, for example to zero, a gate voltage of 2V would be sufficient for Q2.

Returning to the circuit of FIG. 2, therefore, it can be seen that using low threshold devices for the cascaded common gate transistors M2, M3 improves the dynamic range of the circuit, or may allow the use of lower supply voltages.

One potential problem with the use of low-threshold devices is that they will conduct (due to sub-threshold conduction) even when their gate-source voltage is-zero. This problem is overcome in the amplifier circuit 52 of FIG. 2 in that the input transistors M1, M4 are of the regular threshold type, with low leakage currents. The input transistors M1, M4 could also have reduced thresholds, in which case it would be necessary to switch off the supply current to switch off the amplifier. In this case it would also be necessary to AC couple the transistors M1, M4 to the input, and to bias them separately.

The advantage of using low threshold devices in a transmission gate, as in the mixers 58, 60, will be explained with reference to FIG. 4. Specifically, FIG. 4 shows a transmission gate made up of two transistors, one of which Q3 has its gate connected to the supply voltage Vdd, and the other of which Q4 has its gate connected to ground. For each transistor, the gate-source voltage is Vdd/2. Taking the threshold voltage into account, and ignoring back-bias effects, the effective gate voltage is Vdd/2−Vth. For a 3V process, where the threshold voltage is 0.8V, this gives an effective gate voltage of about 0.7V. The lower the effective gate voltage becomes, the greater the problem which arises due to noise. Moreover, if the supply voltage were to be reduced, the effective gate voltage would hardly be high enough to switch the gate on at all. If the threshold voltage is reduced to zero, the effective gate voltage becomes approximately equal to Vdd/2, that is about 1.5V, about twice the value when normal threshold devices are used.

Returning to the circuit of FIG. 2, therefore, it can be seen that using low threshold devices for the transistors M5, M6, M7 and M8 reduces the noise, and also reduces the resistance of the devices in the on state. The use of a lower supply voltage also becomes possible.

One potential problem with the use of low-threshold devices is that they will conduct (due to sub-threshold conduction) even when their gate-source voltage is zero. This problem is overcome in the mixer circuits 58, 60 of FIG. 2 in that the transistors can each be properly switched off by applying a negative gate-source voltage, equal and opposite to the operating voltage Vdd/2.

There are thus disclosed receiver circuits which are able to operate effectively with low supply voltages, without causing problems due to high leakage currents.

What is claimed is:

1. A digital radio transceiver comprising an integrated circuit, the integrated circuit including first MOS transistors with high threshold voltages in the circuits which handle digital signals, and second MOS transistors with reduced threshold voltages in the circuits which handle analog signals.

2. A digital radio transceiver as claimed in claim 1, wherein NMOS transistors amongst the second MOS transistors have negative threshold voltages and PMOS transistors amongst the second MOS transistors have positive threshold voltages.

3. A mobile telephone including a digital radio transceiver claimed in claim 1 having first MOS transistors with high threshold voltages and second MOS transistors with reduced threshold voltages.

4. A digital radio transceiver comprising an integrated circuit, the integrated circuit including analog devices including MOS transistors at least some of which have reduced threshold voltages, and digital devices including MOS transistors at least some of which have high threshold voltages.

5. A digital radio transceiver, comprising analog RF receiver and transmitter components and an analog-digital converter and a digital-analog converter, each including MOS transistors, wherein the analog RF receiver and transmitter components and the analog-digital converter and the digital-analog converter form part of the same integrated circuit, and wherein the MOS transistors in the analog-digital converter and digital-analog converter have high threshold voltages and at least some of the MOS transistors in the analog components have slow threshold voltages.

6. A mobile telephone including a transceiver as claimed in claim 5.

7. A digital radio transceiver, comprising analog devices and digital devices each including MOS transistors, wherein the MOS transistors in the digital devices have high threshold voltages and at least some of the MOS transistors in the analog devices have lower threshold voltages.

8. A digital radio transceiver as claimed in claim 7, wherein the analog devices and digital devices are formed as part of the same integrated circuit.

9. A digital radio transceiver, comprising analog components and digital components each including MOS transistors, wherein the MOS transistors in the digital components have higher threshold voltages than at least some of the MOS transistors in the analog components.

10. A digital radio transceiver as claimed in claim 9, wherein NMOS transistors in the analog components have negative threshold voltages and PMOS transistors in the analog components have positive threshold voltages.

11. A digital radio transceiver, comprising analog RF receiver and transmitter components and an analog-digital converter and a digital-analog converter, each including MOS transistors, wherein the MOS transistors in the analog-digital converter and digital-analog converter have high threshold voltages and the MOS transistors in the analog components have low threshold voltages.

12. A digital radio transceiver as claimed in claim 11, wherein the analog RF receiver and transmitter components and the analog-digital converter and digital-analog converter are formed as part of the same integrated circuit.

13. A digital radio transceiver as claimed in claim 11, wherein NMOS transistors in the analog RF receiver and transmitter components have negative threshold voltages and PMOS transistors in the analog RF receiver and transmitter components have positive threshold voltages.

14. A method of manufacturing a digital radio transceiver integrated circuit, comprising analog components and digital components each including MOS transistors, comprising altering the threshold implantation doses such that the MOS transistors in the digital components have high threshold voltages and at least some of the MOS transistors in the analog components have lower threshold voltages.

* * * * *

UNITED STATES PATENT AND TRADEMARK OFFICE
CERTIFICATE OF CORRECTION

| | | |
|---|---|---|
| PATENT NO. | : 6,973,290 B2 | Page 1 of 1 |
| APPLICATION NO. | : 10/460499 | |
| DATED | : December 6, 2005 | |
| INVENTOR(S) | : Andrej Litwin and Sven Erik Mattisson | |

It is certified that error appears in the above-identified patent and that said Letters Patent is hereby corrected as shown below:

Column 2, Line 46: Change "-3V" to -- -1V--

Column 4, Line 4: Change "cascade" to --cascode--

Column 4, Line 20: Change "cascaded" to --cascoded--

Column 4, Line 25: Change "is-zero" to --is zero--

Signed and Sealed this

Twenty-sixth Day of December, 2006

JON W. DUDAS
*Director of the United States Patent and Trademark Office*